(12) United States Patent
Ruellan

(10) Patent No.: US 8,234,288 B2
(45) Date of Patent: Jul. 31, 2012

(54) METHOD AND DEVICE FOR GENERATING REFERENCE PATTERNS FROM A DOCUMENT WRITTEN IN MARKUP LANGUAGE AND ASSOCIATED CODING AND DECODING METHODS AND DEVICES

(75) Inventor: Hervé Ruellan, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 591 days.

(21) Appl. No.: 11/876,363

(22) Filed: Oct. 22, 2007

(65) Prior Publication Data

US 2008/0098029 A1    Apr. 24, 2008

(30) Foreign Application Priority Data

Oct. 23, 2006    (FR) ..................... 06 54457

(51) Int. Cl.
*G06F 17/30* (2006.01)
(52) U.S. Cl. ...................................... 707/756
(58) Field of Classification Search ............... 707/756, 707/102, 101, 999.102, 999.101
See application file for complete search history.

(56) References Cited

U.S. PATENT DOCUMENTS

| | | | | |
|---|---|---|---|---|
| 5,121,494 A * | 6/1992 | Dias et al. | ............................. | 1/1 |
| 5,987,468 A * | 11/1999 | Singh et al. | ............................ | 1/1 |
| 6,629,097 B1 * | 9/2003 | Keith | ................................... | 1/1 |
| 7,054,850 B2 * | 5/2006 | Matsugu | ......................... | 706/48 |
| 7,251,777 B1 * | 7/2007 | Valtchev et al. | .............. | 715/234 |
| 2005/0022115 A1 * | 1/2005 | Baumgartner et al. | ....... | 715/513 |
| 2005/0289457 A1 * | 12/2005 | Obasanjo et al. | ............. | 715/513 |

OTHER PUBLICATIONS

T. Bray et al., Extensible Markup Language (XML) 1.0 (Fifth Edition), W3C Recommendation Nov. 26, 2008, http://www.w3.org/TR/REC-xml/, 64 pages (downloaded Feb. 23, 2009).
P. Deutsch, "DEFLATE Compressed Data Format Specification Version 1.3", Copyright (c) 1996 L. Peter Deutsch, http://www.ietf.org/rfc/rfc1951.txt, 16 pages (downloaded Feb. 23, 2009).
J. Kangasharju et al., "Xebu: A Binary Format with Schema-based Optimizations for XML Data", WISE 2005, LNCS, pp. 528-535 (2005).
French Preliminary Search Report dated Aug. 6, 2007, regarding French Application 0654457.

(Continued)

*Primary Examiner* — Yuk Ting Choi
(74) *Attorney, Agent, or Firm* — Fitzpatrick, Cella, Harper & Scinto

(57) ABSTRACT

Reference patterns are generated which represent hierarchized data, the hierarchized data being structured in accordance with a schema and being organized in a plurality of items. Primary structural patterns are extracted from the schema, each of the primary structural patterns representing a set of structural information. A list of instances is created for at least one extracted primary structural pattern, each instance associating items of the plurality of items with a primary structural pattern. Instances of one and a same primary structural pattern are grouped into groups of instances according to a predetermined criterion applied on items of distinct instances. For each group, at least one piece of structural information common to each instance of one of the groups of instances is extracted. A reference pattern is generated from the primary structural pattern associated with the one group of instances, the reference pattern including the extracted piece of structural information.

14 Claims, 9 Drawing Sheets

OTHER PUBLICATIONS

C. Werner, et al.: "Compressing SOAP messages by using Differential Encoding", Proceedings of the IEEE International Conference on Web Services (ICWS '04), IEEE Computer Society, pp. 540-547, Jul. 6, 2004.

N. Sundaresan, et al. "Algorithms and Programming Models for Efficient Representation of XML for Internet Applications", Computer Networks, Elsevier Science Publishers B.V., vol. 39, No. 5, pp. 681-697, Aug. 5, 2002.

A. Bia, et al., "UML for Document Modeling: Designing Document Structures for Massive and Systematic Production of XML-based Web Contents", Model Driven Engineering Languages and Systems Lecture Notes in Computer Science; LNCS, Springer-Verlag, BE, vol. 3713, pp. 648-660, 2005.

* cited by examiner

Figure 1

```
<element name="list"
  type="list"/>

<complexType name="list">
  <sequence>
    <element name="person"
      type="person"
      maxOccurs="unbounded"/>
  </sequence>
</complexType>

<complexType name="person">
  <sequence>
    <element name="surname"/>
    <element name="first name"/>
    <element name="town"
      minOccurs="0"/>
  </sequence>
</complexType>
```

Figure 2

```
<list>
  <person>
    <first name>John</first name>
    <surname>Smith</surname>
  </person>
  <person>
    <first name>Mary</first name>
    <surname>Thompson</surname>
  </person>
  <person>
    <first name>Peter</first name>
    <surname>White</surname>
    <town>London</town>
  </person>
</list>
```

METHOD AND DEVICE FOR GENERATING REFERENCE PATTERNS FROM A DOCUMENT WRITTEN IN MARKUP LANGUAGE AND ASSOCIATED CODING AND DECODING METHODS AND DEVICES

BACKGROUND OF THE INVENTION

The present invention concerns a method, a device and a computer program for generating reference patterns able to represent hierarchized data. The invention also concerns a method, a device and a computer program for coding hierarchized data, in particular stored in a document written in a markup language on the basis of reference patterns. The invention also concerns a method, a device and a computer program for decoding coded hierarchized data.

Numerous applications manipulate hierarchically structured data, also termed 'hierarchized data.' A document of hierarchized data incorporates two types of information: a first type of information informing as to the structure of the document and a second type of document informing as to the actual content of the data.

The information of the first type, referred to as 'structural information', is all the information that serves to hierarchize the data, as well as the information serving to describe the type of value or instance taken by the data of the document. The information of the second type, called 'content information', represents the values or instances taken by the data of the document.

The link between the structural information and the content information depends on the language used for hierarchizing the data.

There exist several ways of describing a hierarchized data structure. The most usual one uses the XML markup language, the acronym for 'Extensible Markup Language', that is to say an extensible markup language. This language is standardized by the W3C standardization committee (a description of the language can be found in the website at w3.org in the subdirectory "REC-xml" of subdirectory "TR"). XML is being used more and more for storing and transmitting digital data.

In practice, XML is a format for describing data, not a format for representing or displaying data.

The XML language defines a particular syntax for mixing the structural information and content information. The XML language defines several types of item for describing the structural information and content information. According to this syntax, a node, termed an 'element', is defined by an opening tag, a closing tag and an identifier. Each element can contain other elements or text data.

A leaf item, that is to say an item other than an element, usually represents content and can for example be text, a comment (for example: '<!—comment—>'), a processing instruction (for example: '<?my_processing?>') or an attribute. The attribute is an item located in the opening tag of an element and, apart from the actual content of the attribute, contains an identifier to define it (for example: 'attribute tag="value"').

XML is a syntax making it possible to define new languages. Thus it is made possible to define a plurality of XML languages that can be processed using generic tools.

In addition, XML syntax makes it possible to structure data, which makes it possible to produce documents containing the structural descriptions of the data.

Finally, XML syntax is textual and can be read or written easily by a user.

Several different XML languages can contain elements with the same name. Thus, in order to be able to mix several different XML languages, XML syntax makes it possible to define namespaces. In this way, two elements are identical if they have the same name and are situated in the same namespace.

A namespace is defined by a uniform resource identifier, also called URI (Uniform Resource Identifier), for example: 'http://canon.crf.fr/xml/monlangage'.

The use of a namespace in an XML document is achieved by defining a prefix that is a shortcut to the uniform resource identifier of this namespace.

This prefix is defined by means of a specific attribute. For example, the expression 'xmlns:ml="http://canon.crf.fr/xml/monlangage' associates the prefix 'ml' with the uniform resource identifier 'http://canon.crf.fr/xml/monlangage'.

Next, the namespace of an element or attribute is specified by preceding the name with the prefix associated with the namespace followed by a 'colon' as illustrated in the following example: '<ml:balise ml:attribut="valeur">'.

An XML document format description language making it possible to define the structure of an XML document is for example the language called XML Schema.

An XML schema is itself a language using XML syntax making it possible to define XML languages. It thus makes it possible to define, for an XML language, the elements used by the language, the attributes that these elements contain, their arrangement, etc.

An XML schema therefore defines the syntax of an XML language or a part of a language. The schema defines the structure of the hierarchized data contained in documents written in XML language. In particular, for each element of the XML language, the XML schema defines the name, the namespace, the content of the element and the list of the attributes of the element, specifying in particular whether or not an attribute is obligatory, and whether other attributes can be added as well as the type of content of each attribute. The content of an element may for example be data, sub-elements or a combination of the two.

Thus an XML schema is a set of definitions, each definition corresponding to an XML item. These definitions are connected together either by being included in one another or by using references. Each definition specifies not only the content of an XML item but also its relationships with the other close XML items (for example the number of instances possible for this XML item, the possibility of co-occurrence of an instance of this definition with an instance of another definition, etc).

The schema can define the content of an element more precisely by specifying a type for the content. In the case of data, the type of the element corresponds to the type of the data, for example character string, integer, etc. In the case of sub-elements, the type of the element defines the sub-elements present, their number and their order.

An XML schema can not only be used to define the syntax of an XML language but also makes it possible to verify that a document written in XML language complies with the syntax of the XML language to which it belongs. This verification process is called validation. It makes it possible to prevent an application processing an erroneous document.

Markup languages, in particular the XML language, are used to store data in a file or to exchange data. It makes it possible in particular to have available numerous tools for processing the files generated. In addition, a document written for example in XML can be edited manually with a simple text editor. Moreover, given that a document written in markup language, for example XML, contains its structure integrated in the data, this document is made legible without even knowing its specification.

However, XML syntax is very prolix. Thus the size of an XML document can be several times greater than the intrinsic size of the data. This large size of XML documents therefore gives rise to a long processing time when such documents are generated and in particular when XML documents are read.

Various methods are known for compressing a document without losing data.

Thus the 'zip' or 'gzip' compression methods make it possible to code a document in a compressed form that uses less memory space than the original document. These compression methods are reversible and it is therefore possible to find the original document again. These methods are based on the algorithm called 'DEFLATE' defined by the document RFC 1951 and accessible at the following Internet address: http://www.ieff.org/rfc/rfc1951.txt.

The 'DEFLATE' algorithm is based on the detection of repetitions in order to reduce the size of the coded data. Thus, when the algorithm detects that a data sequence has already appeared in the document, the algorithm stores a reference to this data sequence instead of storing the data sequence. In this way, the coding of several repetitions of the same data sequence is effective.

The 'zip' or 'gzip' compression methods do however have a certain number of disadvantages in compressing XML files. This is because these methods do not have knowledge of the XML syntax and can in no way exploit the specificities of this language in order to effectively code an XML document. In addition, these methods make it possible to effectively code only the identical repetitions of the same data sequence.

To mitigate these drawbacks, other compression methods have been adapted to the XML syntax. Thus one solution is to code the structural information in a binary format instead of using a text format. Several methods exist for this, one example being the ISO standard FastInfoset defined by the specification ITU-T Rec. X.891.

In addition, the redundancy of the structural information in the XML format is eliminated or at least decreased, for example, by omitting the name of the element in the opening tag and closing tag.

According to another method, the XML schema associated with an XML document is used to code the document. This is because the XML schema describes the structure of the data stored in the XML document, the use of the schema makes it possible not to code some of the structural information of the data of the XML document, the latter being able to be reconstructed by the decoder by means of the same XML schema.

This is because it is known, in particular in the FastInfoset standard, how to use an XML schema in order to generate an index table for the names of the elements and attributes. In addition, the schema can make it possible to generate an index table for the predefined contents or those whose options are specified in the XML schema. These tables being constructed from the XML schema, they are not inserted when the XML document is coded.

In addition it is known how to use an XML schema in order to take account of the type of a value in order to code it. This is because XML syntax does not directly support typed data and codes all the data in text form. The Xebu format, described in the article entitled 'Xebu: A Binary Format with Schema-Based Optimizations for XML Data' by Jaakko Kangasharju, Sasu Tarkoma and Tancred Lindholm published at the time of the WISE 2005 conference, makes it possible for example to take account of the type of a value in order to code it.

However, an XML schema makes it possible to specify the types of data. With such a method, an integer or a real will therefore no longer be coded in a fairly ineffectual text form but in an optimized form, in terms of both size and coding and decoding time.

These methods make it possible to code more effectively the data contained in an XML document, whilst allowing the reconstruction of the XML document.

Thus it is possible to use a method such as Xebu or FastInfoset in order to generate a compact representation of an XML document, using certain properties of XML syntax, and then to use a generic compression method such as 'zip' or 'gzip' in order to compress this compact representation.

Such a combination makes it possible to reduce the size of the document generated but is performed in two steps, both at coding and at decoding, which requires a large amount of calculating power and makes it necessary to store intermediate data.

In addition, a generic compression method such as 'zip' or 'gzip' cannot take account of the properties of XML syntax or of the compact representation used to improve the compression ratio and/or the compression or decompression time.

SUMMARY OF THE INVENTION

The present invention aims firstly to provide a method of generating reference patterns able to represent hierarchized data, the hierarchized data being structured in accordance with a schema, the hierarchized data being organized in a plurality of items, characterized in that it comprises the following steps:

extracting primary structural patterns from the schema, each of the primary structural patterns representing a set of structural information;

associating items in the plurality of items with at least one primary structural pattern extracted;

grouping the associated items according to a predetermined criterion; and determining one reference pattern per group of items from associated primary structural patterns; the said reference pattern comprising at least one piece of structural information able to represent at least one piece of structural information of each item of the group that is associated with it.

The invention makes provision for analyzing the schema of the hierarchized data in order to extract therefrom structural patterns referred to as primary structural patterns. A structural pattern is the description of part of the structure of the hierarchized data.

A schema is a definition of the structure of all the hierarchized data.

The hierarchized data is in particular described in a markup language structuring the data, for example using the XML language.

The object of the invention is to find patterns containing structural information that are reproduced in the hierarchized data.

To do this, the method according to the invention makes provision for determining, from the primary structural patterns extracted from the schema and the items associated with these primary structural patterns, reference structural patterns able to represent hierarchized data.

In addition, it should be noted that, in accordance with the invention, if the reference pattern comprises a plurality of structural information, at least one piece of structural information of each item in the group is represented by at least one piece of structural information of the reference pattern, the said at least one piece of information being able to be different according to the items in the group.

Subsequently, the reference patterns will make it possible in particular to code this data so as to reduce the size of this data.

The method is based in particular on a step of grouping together the items associated with the primary structural patterns according to a predetermined criterion.

According to a particular embodiment, the grouping of the items in groups of items is carried out by grouping the items associated with one and the same primary structural pattern.

According to this characteristic, the items that are associated with one and the same primary structural pattern, that is to say that have the structural information present in the primary structural pattern, are grouped together. These items can thus be coded with respect to their common primary structural pattern.

According to a particular characteristic, the grouping of the items in groups of items is carried out by grouping items having identical content information.

According to this characteristic, the items that have identical content information, that is to say that have the same data, are grouped together. Thus, during the coding of these items, the identical content information will be coded only once.

According to another particular characteristic, the grouping of the items in groups of items is carried out by grouping items having identical structural information.

According to this characteristic, the items that have identical structural information are grouped together, this structural information being complementary to that present in the primary structural patterns. Thus, when these items are coded, a larger number of pieces of structural information will be coded only once.

According to another particular characteristic, the reference pattern also comprises at least one piece of structural information common to a high number of items in the group.

According to this characteristic, the reference pattern is augmented with structural information present in a large number of items in the group. Thus the structural information frequent for the items in the group will be coded only once.

According to one embodiment, the reference pattern also comprises at least one piece of content information present in a high number of items in the group.

According to a particular characteristic, the step of determining a reference pattern comprises the following substeps for at least one group of items:
extracting the structural information and content information common to a high number of items in said group;
determining a reference pattern containing the said structural information and the said common content information extracted; the said reference pattern being able to represent some of the structural information and content information of items in said group.

Thus, if the items in a group have a similar part but the rest of these items varies greatly, it is however possible to code only once the common information present in this similar part. In addition it remains possible to find similarities for the remaining parts of the items in this group and thus to group them together with other items.

According to one embodiment, if the number of items in a group of items is less than a predetermined threshold, the said group of items is assembled with another group of items.

According to a particular characteristic, the said group of items is assembled with the group of items closest to the said group of items with respect to a distance measurement.

According to this characteristic, the group is assembled with another group at a small distance in order to determine a common reference pattern able to represent the items in the whole of the group thus formed.

According to one characteristic, the distance measurement between two group of items depends on the number of differences between the primary structural patterns associated with the items.

According to a particular characteristic, the distance measurement between two groups of items depends on the number of differences between the structural information and the content information of the items.

According to another particular characteristic, in the absence of a group of items situated at a distance less than a predetermined threshold, for items in the group, the reference pattern is the primary structural pattern associated with this item.

This makes it possible to obtain a reference pattern for coding an item in all cases.

The invention also concerns a method of coding hierarchized data, the hierarchized data being structured in accordance with a schema, characterized in that it comprises the following steps:
obtaining reference patterns able to represent hierarchized data structured in accordance with said schema, said reference patterns being generated according to the reference pattern generation method according to the invention;
determining difference information between the reference patterns and the associated hierarchized data;
coding the hierarchized data according to the reference patterns and difference information.

In accordance with this method, structural reference patterns are generated according to the method of the invention previously described so as to recode the hierarchized data with a view to reducing the coding size of this hierarchized data.

This is because, after having determined the structures of the hierarchized data from the schema of this data (by means of the reference structural patterns), this data is recoded using the reference structural patterns. In this way, coding of the structural information for each data item is avoided and thus the coding size of the hierarchized data is significantly reduced.

According to one characteristic, the method also comprises a step of coding at least one reference pattern used for coding hierarchized data.

According to another characteristic, the step of coding at least one reference pattern comprises, for each reference pattern, the following steps:
coding identification information for the primary structural pattern associated with said reference pattern;
coding structural information of said reference pattern.

According to this characteristic, the coding of a reference pattern consists of storing identification information for a primary structural pattern able to be extracted from the schema of the data and coding structural information of the reference pattern.

According to a particular characteristic, the step of coding at least one reference pattern also comprises, for at least one reference pattern, a step of coding at least one piece of content information of said reference pattern.

The invention also concerns a method of decoding coded hierarchized data, the hierarchized data being structured in accordance with a schema, characterized in that, said hierarchized data being coded according to reference patterns and difference information, the reference patterns being determined from at least one primary structural pattern extracted from the schema, the method comprises a step of decoding the coded hierarchized data according to the reference patterns and difference information.

According to a particular characteristic, the method comprises a step of decoding at least one coded reference pattern.

According to another characteristic, the step of decoding at least one coded reference pattern comprises the following steps:
extracting primary structural patterns from the schema, each of the primary structural patterns representing a set of structural information;
and for each coded reference pattern,
decoding identification information for the primary structural pattern associated with said coded reference pattern;
obtaining reference patterns from the primary structural pattern extracted corresponding to the decoded identification information and structural information of said coded reference pattern.

According to a particular embodiment, the step of decoding at least one coded reference pattern also comprises, for at least one coded reference pattern, a step of decoding at least one piece of content information of said reference pattern.

The invention also relates to a device for generating reference patterns able to represent hierarchized data, the hierarchized data being structured in accordance with a schema, the hierarchized data being organized in a plurality of items, characterized in that it comprises the following means:
means of extracting primary structural patterns from the schema, each of the primary structural patterns representing a set of structural information;
means of associating items in the plurality of items with at least one primary structural pattern extracted;
means of grouping together associated items according to a predetermined criterion; and
means of determining a reference pattern per group of items from associated primary structural patterns; said reference pattern comprising at least one piece of structural information able to represent at least one piece of structural information of each item in the group that is associated with it.

Likewise, the invention proposes a device for coding hierarchized data, the hierarchized data being structured in accordance with a schema, characterized in that it comprises the following means:
a device for generating reference patterns able to represent hierarchized data structured in accordance with said schema, in accordance with the invention;
means of determining difference information between the reference patterns and the associated hierarchized data; and
means of coding hierarchized data according to the reference patterns and difference information.

In addition, the invention proposes a device for decoding coded hierarchized data, the hierarchized data being structured in accordance with a schema, characterized in that said hierarchized data is coded according to reference patterns and hierarchized data, the reference patterns being determined from at least one primary structural pattern extracted from the schema, the device comprises means of decoding the hierarchized data according to the reference patterns and difference information.

These devices have the same advantages as the methods briefly described above and will therefore not be repeated here.

The present invention also relates to a storage means, possibly partially or totally removable, able to be read by a computer or microprocessor storing instructions of a computer program, permitting the implementation of the methods as disclosed above.

Finally, the present invention relates to a computer program product able to be loaded into a programmable apparatus, containing sequences of instructions for implementing the methods as described above, when this program is loaded into and executed by the programmable apparatus.

BRIEF DESCRIPTION OF THE DRAWINGS

Other aspects and advantages of the present invention will emerge more clearly from a reading of the following description, this description being given solely by a way of non limiting example and made with reference to the accompanying drawings, in which:

FIG. 1 illustrates an XML schema;

FIG. 2 illustrates an XML document containing hierarchized data corresponding to the XML schema with reference to FIG. 1;

DETAILED DESCRIPTION OF THE INVENTION

Figure 3:
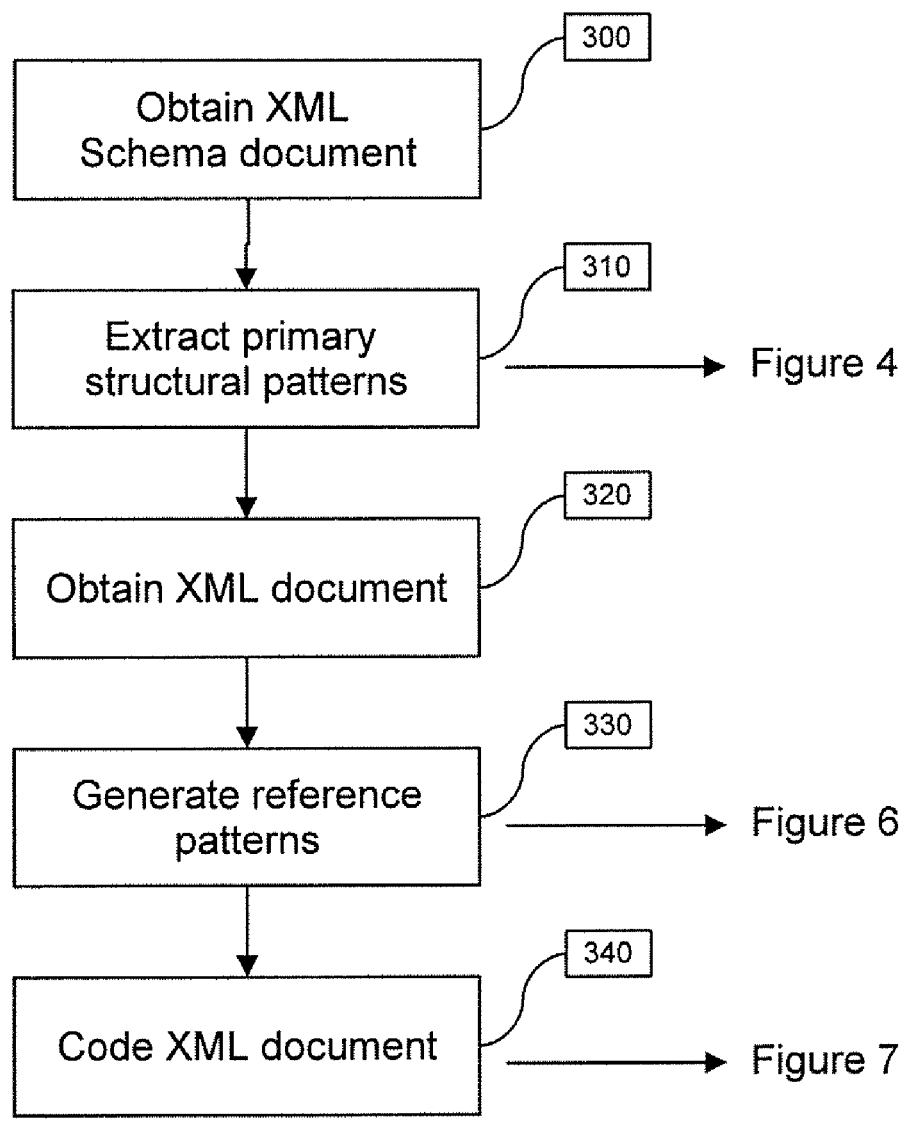
FIG. 3 depicts a general algorithm for generating reference and coding patterns in accordance with the invention.

An objective of the invention is to obtain a compact coding of the hierarchized data in particular stored in documents written in markup language such as XML.

The invention is described in relation to the 'XML Schema' standard. However, other schemas exist to define the structure of a set of hierarchized data in particular stored in XML documents. Thus the invention also applies to these other languages. Examples of schemas are the Documents Type Definition (DTD) and the XML document description language called Relax NG.

In order to obtain a compact coding of an XML document, the invention extracts primary structural patterns from the XML schema document associated with the XML document. The primary structural patterns contain structural information for this XML document described in the XML schema. Next, from the content of the XML document, the invention constructs reference patterns representing more precisely the structural information of this XML document and possibly certain content information of this XML document.

There is now described with reference to FIG. 1 an example of an XML schema, describing an XML syntax for hierarchized data containing a list of persons. It should be noted that this example has been slightly simplified with respect to the 'XML Schema' standard in order to facilitate reading thereof.

This list is contained in an element called 'list.' This 'list' element can contain an indefinite number of 'person' elements. This is because the number of occurrences ('maxOccurs' according to the XML specification) takes the non-limited value. Each 'person' element describes a person and is of the 'person' type. A 'person' element is composed of an element entitled 'first name', an element entitled 'surname' and an optional element entitled 'town.' The element 'town' also defines the minimum number of occurrences of this element. According to the example, the occurrence defined by the attribute 'minOccurs' according to the XML specification takes the value 0, indicating in this way that this element is optional. These three elements contain a value that is a string of characters (the definition of the type of this value has been omitted in FIG. 1 for reasons of legibility).

From this XML schema, in accordance with the invention, primary structural patterns will be created. For this purpose, the principal element, namely the element 'list' according to the example, is considered first. For this element, a primary structural pattern is created. As defined by the type 'list', this primary structural pattern comprises a set of 'person' elements.

As the number of 'person' elements contained in a 'list' element is not defined, a primary structural pattern is created for the 'person' element P, and it is indicated in the primary structural pattern of the 'list' that the 'list' element comprises an unknown number of elements of the 'person' type.

When the primary structural pattern is created for the 'person' element, this pattern comprises the information according to which a 'person' comprises an element 'first name', an element 'surname' and an optional element 'town'. Thus when a 'person' element is coded by means of this primary structural pattern, this suffices to indicate whether this primary structural pattern contains the optional element 'town', as well as the content of the sub-element of this 'person' element.

A description is now given with reference to FIG. 2 of an example of an XML document containing hierarchized data corresponding to the XML schema previously described with reference to FIG. 1.

From this XML document and from the primary structural patterns created previously, reference patterns are created in accordance with the invention.

According to the example in FIG. 2, the first two 'person' elements do not have a sub-element 'town.' For this reason, a reference pattern P1, defined from the primary structural pattern created for the 'person' element P and not including the sub-element 'town', is created.

Concerning the third 'person' element, this has a sub-element 'town' and then a reference pattern P2, defined from the primary structural pattern created for the 'person' element P and including the sub-element 'town', is created.

Thus, when the hierarchized data of the XML document of FIG. 2 is coded, the reference pattern P1, being able to represent several elements of the document, will actually be used for the coding of the data, in particular for coding the first two 'person' elements. However, the reference pattern P2 being able to represent only a single element of the XML document, this pattern is not used during the coding of the document and in particular for coding the third element. The latter will be coded from the primary structural pattern P, which will be considered to be a reference pattern.

With reference to FIG. 3, a general algorithm for generating reference and coding patterns in accordance with the invention is now described.

The algorithm begins at step 300 with the obtaining of a document storing an XML schema. Then, during the following step (step 310), this XML schema is analyzed in order to extract primary structural patterns. This analysis is described below with reference to FIGS. 4 and 5.

Step 310 is followed by step 320, consisting of obtaining an XML document storing hierarchized data corresponding to this XML schema.

During the following step (step 330), reference patterns for this XML document are generated. This generation is described below with reference to FIG. 6.

Finally, during step 340, which follows step 330, the hierarchized data of the XML document is coded by means of these reference patterns. The coding of the hierarchized data of the XML document is described below with reference to FIGS. 7 and 8.

It should be noted that steps 320 to 340 can be repeated several times on sets of hierarchized data since this data is described with respect to the same XML schema, step 310 of extracting primary structural patterns having been performed previously.

According to a particular embodiment, primary structural patterns generated for an XML schema are stored. Thus, when an XML document is obtained, the corresponding XML schema is sought. If this XML schema has already been processed as described with reference to step 310, the associated primary structural patterns are reloaded from the memory where they are stored.

According to a particular embodiment, if the primary structural patterns contain little choice, or if the XML document is small, or if the XML document must be processed rapidly, the reference patterns are not generated, and only the primary structural patterns are used during the coding of the data.

This is because, if the primary structural patterns contain little choice, it is probable that the creation of reference patterns will afford only a slight gain compared with the direct use of the primary structural patterns.

Likewise, if the XML document is small, it will probably contain only a few repetitions and it is therefore improbable that reference patterns able to represent several elements of the XML document will be found. The size of the XML document can be evaluated according to the size of the XML schema (or even of the content thereof). This is because it is possible to effect a correlation between the size of the XML schema and the minimum size of the XML document.

Finally, if the XML document must be processed rapidly, even if the use of reference patterns may be useful, it is sometimes preferable to choose a saving in calculation time rather than a saving in document size.

Naturally, these three conditions may be combined with each other.

According to another embodiment, reference patterns are created from a set of XML documents storing hierarchical data, this data being written with respect to the same XML schema. These reference patterns are constructed from all this hierarchical data stored in all the XML documents, rather than by considering the data of a single document. Next these reference patterns are stored and the primary structural patterns are stored in association with the XML schema. Thus, when the data of an XML document structured in accordance with a schema is coded, instead of extracting the reference patterns of this new XML document, the predefined reference patterns are used. This embodiment makes it possible to obtain a saving in calculation time, with as a counterpart a slight loss with regard to the coding size of the XML documents.

In addition, it is possible to change in advance fixed reference patterns, which will no longer have to be coded for each XML document.

Figure 4:
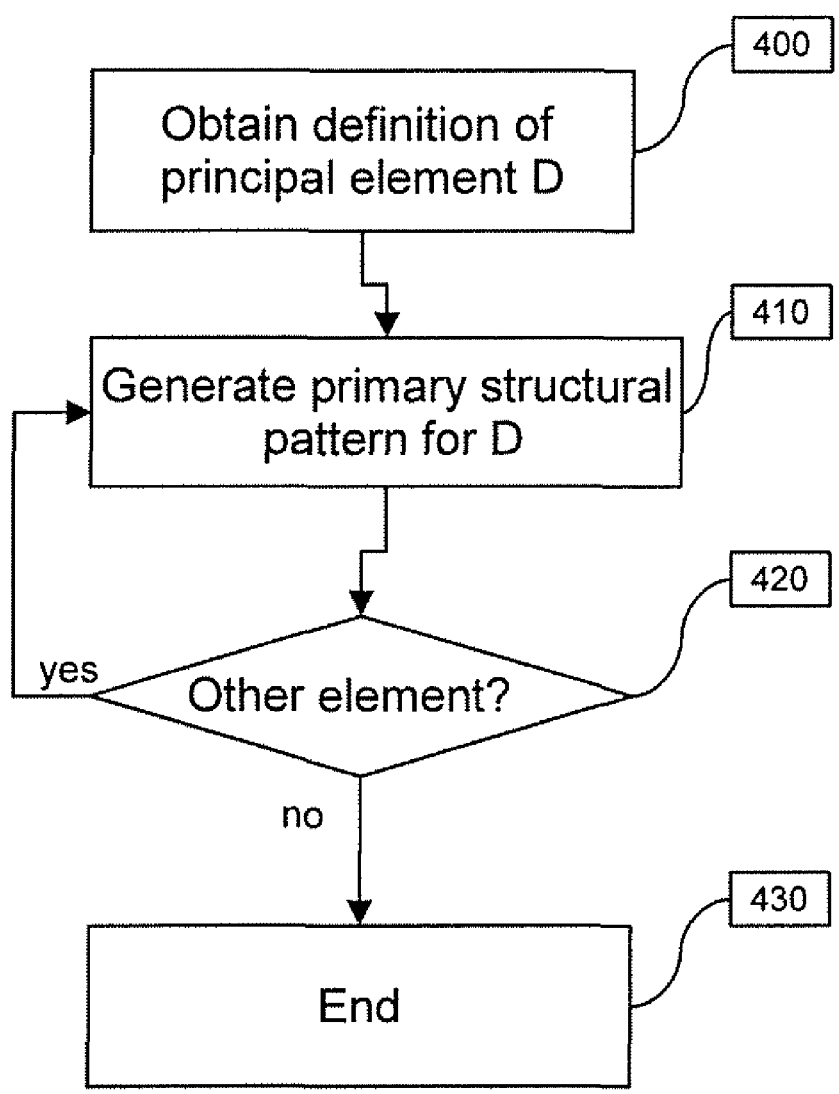
FIG. 4 depicts a general algorithm for extracting primary structural patterns from an XML schema in accordance with the invention.

There is now described, with reference to FIG. 4, a general algorithm for extracting primary structural patterns from an XML schema in particular stored in a document.

The algorithm begins at step 400 with the obtaining of a first principal element D defined in the XML schema.

Figure 5:
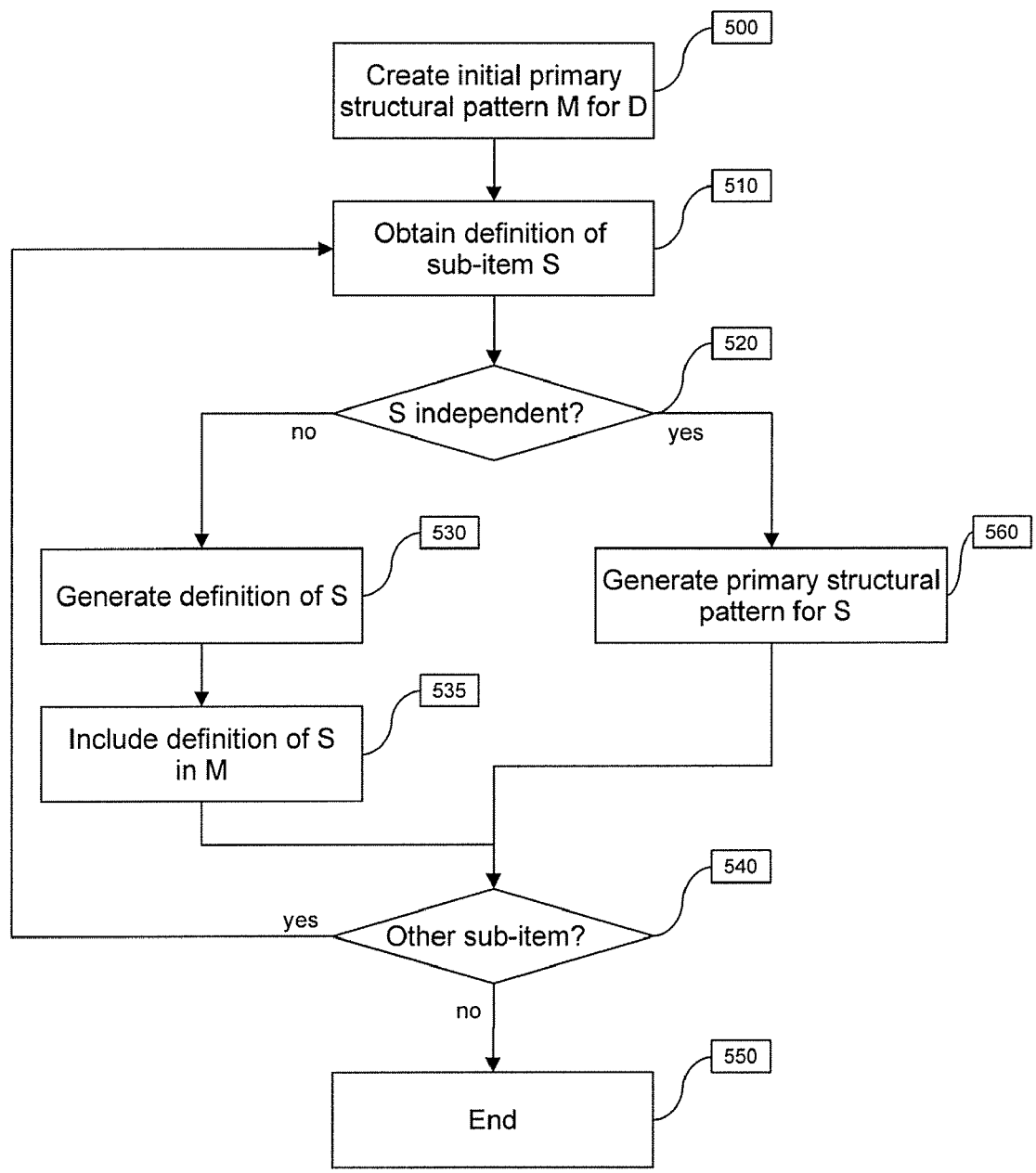
FIG. 5 depicts an algorithm for creating a primary structural pattern for a principal element of an XML schema in accordance with the invention.

Step 400 is followed by step 410, during which a primary structural pattern is generated for this element D as described below with reference to FIG. 5.

Next, the algorithm continues at step 420, during which it is checked whether another non-processed principal element D exists.

If there is no longer any principal element to be processed, then the algorithm is ended at step 430.

If on the contrary a principal element D remains to be processed, then its definition is obtained and the algorithm continues at the previously described step 410.

If the XML schema uses other XML schemas to define the XML language to which it corresponds, then in accordance with the 'XML Schema' standard the other XML schemas are processed as if they were included in the principal XML schema.

An algorithm for creating a primary structural pattern for a definition D of an item of an XML schema is now described with reference to FIG. 5. This definition can be a global definition in the XML schema, also referred to as a higher level definition, or may be a local definition contained in another definition.

The algorithm begins at step 500 with the creation of a primary structural pattern M for the definition D.

Initially, this primary structural pattern M comprises the information corresponding to the principal item of the definition D. This primary structural pattern M will be completed by the remainder of the algorithm.

However, if the definition D does not comprise any definition of a sub-item, then the algorithm is ended.

In the general case, the algorithm continues at step 510, during which the first definition of the sub-item S contained in definition D is obtained.

Step 510 is followed by step 520, during which it is checked whether this definition S is independent of the definition D.

This test consists of checking in particular whether an instance of the definition D and an instance of the definition S are strongly linked or not.

Thus, in the example of the XML schema illustrated with reference to FIG. 1, an element 'list' and a sub-element 'person' are not strongly linked, since an element 'list' may contain an indeterminate number of sub-elements 'person.' On the other hand, the element 'person' and its sub-element 'first name' are strongly linked since a sub-element 'person' routinely contains a single sub-element 'first name.'

According to one embodiment, this check consists of checking the multiplicity of occurrences of the sub-item corresponding to the definition S. This is because, if the sub-item corresponding to the definition S has an indeterminate number of occurrences or with a variance greater than a predetermined value, then the definition S is not considered to be strongly linked to the definition D.

In addition, if the definition of the sub-item S is used in several definitions, then the definition S is not considered to be strongly linked to the definition D.

In addition, if the definition S is not clearly identified, for example in the case where it corresponds to a free content ('xs:any' according to the XML schema specification) or if this definition is a choice among a large number of variants, then it is not considered to be strongly linked to the definition D.

According to another particular embodiment, the link between the definition of the sub-item S and the definition D is dependent on the type of sub-item defined by S. For example, the definition of an attribute will be considered to be more linked than the definition of a child element.

According to a particular embodiment, the criteria described above determining whether the definition of a sub-item S is strongly linked to the definition D are tolerant. This is because the patterns are preferably decomposed when the reference patterns are created as described with reference to FIG. 6 rather than when the primary structural patterns are created.

If the definition S is not independent of the definition D, then the algorithm continues at step 530, during which a primary structural pattern is created to represent the definition S, recursively calling the algorithm for the definition S.

This step is followed by step 535, during which the primary structural pattern is included for the definition S in the primary structural pattern M of the definition D of the element in question.

The algorithm continues at step 540, during which it is checked whether there exists another definition of a sub-item S not yet processed.

If such is the case, the definition is processed. To do this, the algorithm continues at the previously described step 510.

Otherwise the algorithm ends during step 550, and the creation of the primary structural pattern M describing the definition D is ended.

Returning to step 520, if the definition of a sub-item S is independent then the algorithm continues at step 560, during which a primary structural pattern is created for this definition, recursively calling the algorithm for this definition S. In this case, the primary structural pattern M of the definition D is completed by the indication of a free content.

Step 560 is followed by the previously described step 540.

According to a particular embodiment, a primary structural pattern corresponds to the definition of an element and its content or part of the content. However, a primary structural pattern can correspond to any definition contained in an XML schema, for example a group of attributes, a sequence of elements, etc.

Figure 6:
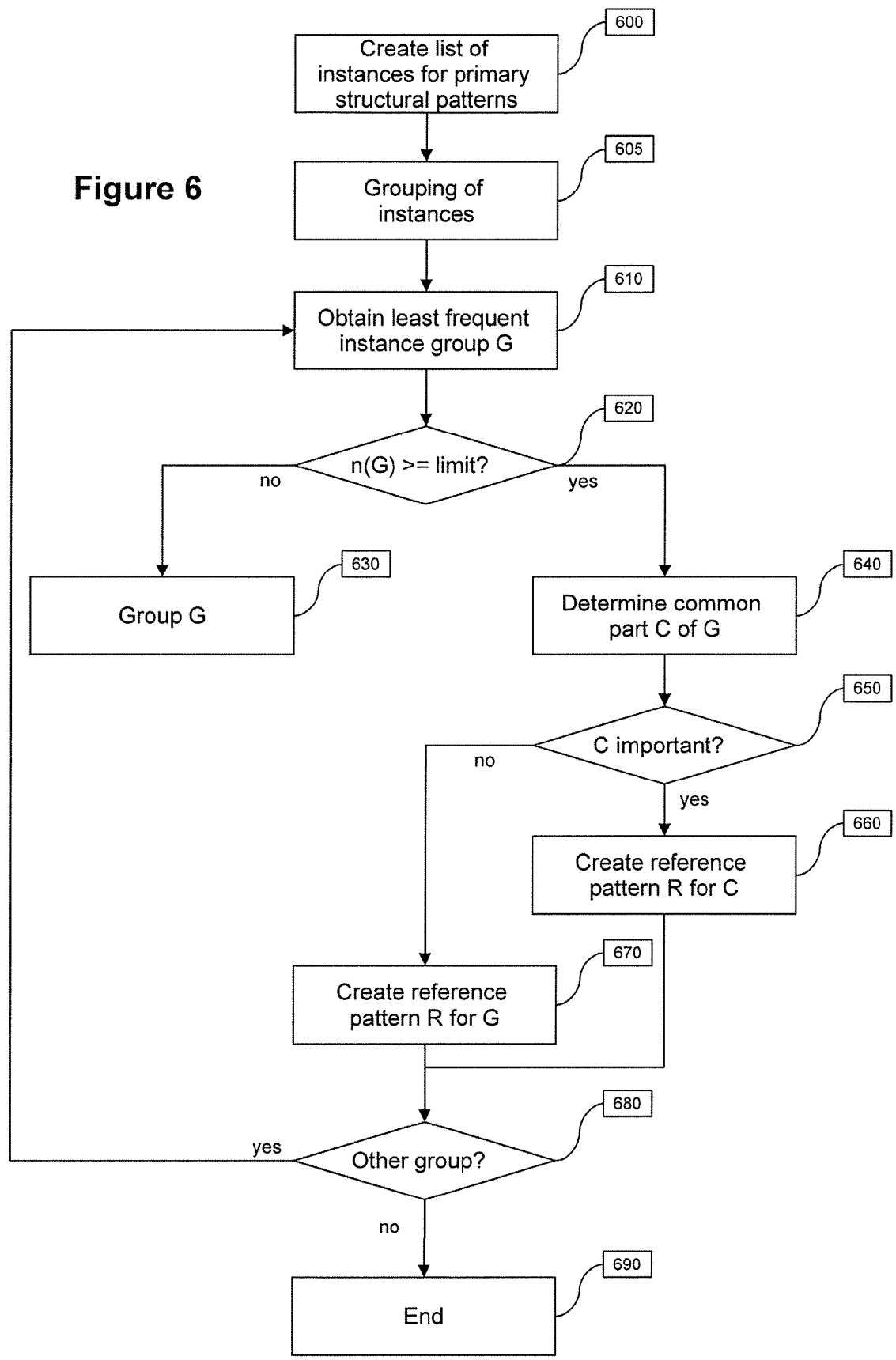
FIG. 6 depicts an algorithm for generating reference patterns in accordance with the invention.

An algorithm for generating reference patterns is now described with reference to FIG. 6. This generation is carried out using the primary structural patterns created from the schema and the content of an XML document associated with this schema.

The algorithm begins at step 600, consisting of creating a list of the elements of the XML document, referred to as instances, for the previously created primary structural patterns.

To do this, the XML document and the schema are run through and then, by means of the schema, each item of the XML document is associated with the corresponding primary structural pattern (if this primary structural pattern exists).

It should be noted that, for an item of the XML element type, generally, when this element is associated with a primary structural pattern, part of the content of this element is associated with the same primary structural pattern. All these items then form an instance of the primary structural pattern.

The algorithm continues at step 605 by grouping together the instances that are similar to one another.

According to one embodiment, two instances are considered to be similar if they correspond to the same primary structural pattern, and comprise the same structural choices with respect to this primary structural pattern.

According to another embodiment, similarity also implies that the contents of the instances, for example with regard to the values of the attributes and the values of the textual content, are identical.

The purpose of the remainder of the algorithm is to create, for each group of similar instances, the most suited reference pattern.

For this, step 605 is followed by step 610, during which firstly the group G of similar instances having the fewest elements is considered.

The algorithm continues at step 620, during which it is tested whether the number of instances of the group G represented by the variable n(G) is greater than or equal to a predetermined threshold.

If such is not the case, the algorithm continues at step 630, during which this group of instances is joined with the closest group of instances. For this, the algorithm calculates a distance between this group of instances G and the other groups of instances.

According to one embodiment, the distance between two instances depends on the one hand on the number of differences between the primary structural patterns corresponding to these instances, a difference being for example the addition, elimination or modification of an element or an option between these primary structural patterns and, on the other hand, the number of differences between the instances, for example with regard to the structural choices and the content. These differences may be weighted according to their relative importance.

According to a particular embodiment, the distance between two groups of instances depends on the distance between the instances of these two groups and the number of instances in each group.

It should be noted, that if no group of instances is sufficiently close to the group of instances G, then it is eliminated and the reference pattern used by each of its instances is the primary structural pattern associated with the instance. This primary structural pattern is then considered to be a reference pattern.

The algorithm continues at step 680, during which it is checked whether another group to be processed remains.

If such is the case, the algorithm continues at the previously described step 610.

In the contrary case, the algorithm is ended at step 690.

Returning to step 620, if the number of instances of the group of instances G is greater than or equal to the predetermined threshold, then the algorithm continues at step 640, during which it is attempted to create a reference pattern for the group of instances G.

For this, the common part C of all the instances of the group of instances G is determined. This determination amounts to seeking a structure common to all the instances in the group of instances G.

According to one embodiment, this determination step can be performed as a search for structural patterns for all the instances of the group G.

According to another embodiment, the determination step can be performed by seeking, firstly, the most frequent XML item within the instances of the group G. This item is preferably an element, but may be text, an attribute or any other XML item. This item forms the core of the common structure.

This common structure is then extended to the adjoining items, by checking for each adjoining item whether it is present in a large proportion, in particular in a predetermined proportion of instances of the group G and, if such is the case, by including this adjoining item in the common structure. Thus, from a core, the common structure is extended gradually.

It should be noted that, in this search for a common structure, the contents of the items may or may not be taken into account according to the number of instances having the same values. Thus, if for an element, one of its contents has the same value for the majority of the instances comprising this element, the value of this content is then integrated in the common structure.

The algorithm then continues at step 650, during which it is checked whether the common part determined during step 640 is important. This verification is made by comparing the size of the common part with the size, in particular the mean size, of the instances of the group G and also depends on the number of instances of the group G containing this common part.

Thus, in the example in FIG. 2, if the group of items consisting of the three 'persons' elements is considered, the common part of the elements in this group consist of the elements 'person', 'first name' and 'surname.' It can therefore be considered to be important since on the one hand it corresponds to all the structural information of two of the items in the group and to the major part of the third item in the group and on the other hand it is common to the three elements in the group.

If the common part is determined as being important according to the criteria described above, then the algorithm continues at step 660, during which it creates a reference pattern R in order to represent this common part C.

This reference pattern R is created from one of the primary structural patterns associated with an instance comprising the common part C, and according to the structural choices made in the common part as well as values integrated in the common part.

The primary structural pattern chosen is the one that is closest to the common part, that is to say the primary structural pattern comprising the fewest options not chosen by the common part.

The instances comprising this common part are then decomposed. For this purpose, for each instance, the part corresponding to the common part C is isolated and associated with the reference pattern R, while the remaining part or parts are kept. The remaining parts kept are then distributed in new groups of similar instances, while the instances not comprising the common part are all grouped together in another new group.

Step 660 is followed by the previously described step 680.

If, during step 650, the common part is not important within the meaning of the importance criterion defined above with respect to step 650, then the algorithm continues at step 670, during which it is attempted to create a reference pattern for the group of instances G. If the instances contained in the group G do not correspond to the same primary structural pattern, then no reference pattern is created and the reference pattern for these instances is their associated primary structural pattern.

If the instances in the group G correspond to the same primary structural pattern, then their structural choices and their contents are compared.

If the number of common structural choices and identical content values is greater than a predetermined threshold, then a new reference pattern is created from the primary structural pattern in order to represent the structural choices and these content values. This reference pattern is associated with the instances included in the group G.

Otherwise no reference pattern is created and the reference pattern for these instances is their associated primary structural pattern.

According to a variant embodiment, each structural choice and each content value is weighted by its importance during the counting of these elements. For example, a choice between ten possibilities is more important than a choice between two possibilities.

It should also be noted that a reference pattern can keep several structural possibilities. This makes it possible either to reduce the number of possibilities present in the reference pattern compared with those present in the primary structural pattern, or to specify a large number of constant values in the reference pattern.

It should also be noted that, for the same content, several values can be defined in a reference pattern. This corresponds for example to the enumerations defined in the XML schemas.

It should also be noted that a structural choice may correspond to the reduction of the possibilities for the values of a content, for example by reducing the number of possible values for an enumeration or specifying the type of a value.

It should also be noted that the definition of a value in a reference pattern can use the type of this value if this is specified in the XML schema.

After step 670, the algorithm continues at the previously described step 680.

Figure 7:
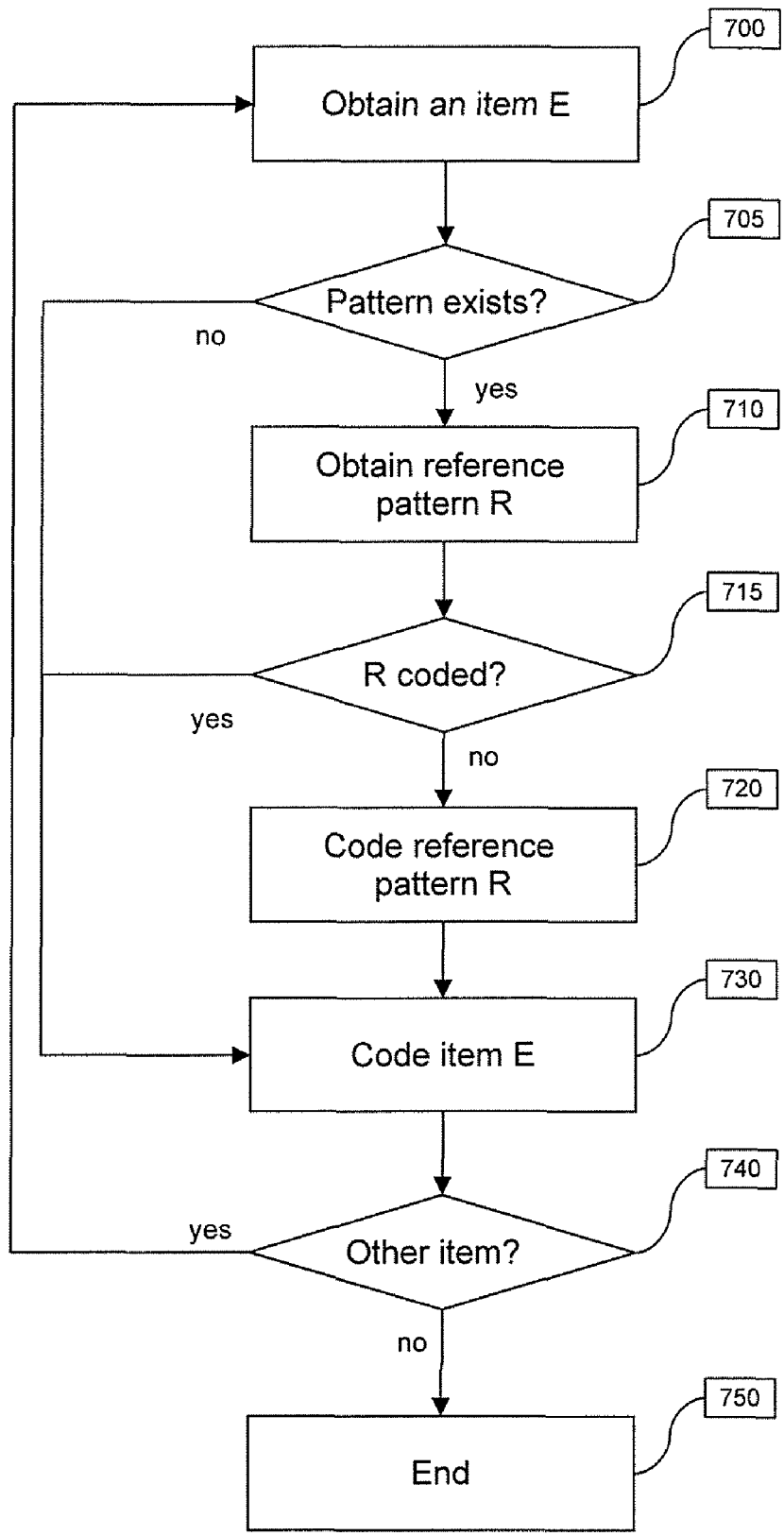
FIG. 7 depicts an algorithm for coding hierarchized data in accordance with the invention.

There is now described, with reference to FIG. 7, an algorithm for coding the hierarchized data contained in an XML document by means of reference patterns. This algorithm is used for all the items in the XML document not coded as a sub-item of another item.

The algorithm begins at step 700, consisting of obtaining a first non-processed item E of the document XML.

Next the algorithm continues at step 705, during which it is checked whether an item E has an associated reference pattern.

If such is not the case, then the algorithm continues at step 730 described below.

On the other hand, if the item E has an associated reference pattern, then the algorithm continues at step 710, during which the reference pattern R associated with this first item E is obtained.

The following step (step 715) checks whether the reference pattern R is coded.

If such is the case, the algorithm continues at step 730 described below.

In the contrary case, the algorithm continues at step 720, during which the reference pattern R is coded. For this, the identification of the primary structural pattern on which the reference pattern R depends is coded, with if necessary the indication of the part of the primary structural pattern corresponding to the reference pattern R. Next, all the structural choices of the reference pattern R are coded, as well as all the values of contents of the reference pattern R.

Next the algorithm continues at step 730, during which the item E is coded. This step is described below with reference to FIG. 8.

If items contained directly or indirectly in the item E are described by the reference pattern R, these items are coded using this same algorithm.

If the reference pattern R does not exist, then the item E is coded using a conventional method and then all the child items of the item E are coded recursively using the algorithm described here.

The algorithm continues at step 740, during which it is checked whether other items to be coded remain. If such is the case, the algorithm continues at the previously described step 700.

When all the items are coded, then the algorithm ends at step 750.

Figure 8:
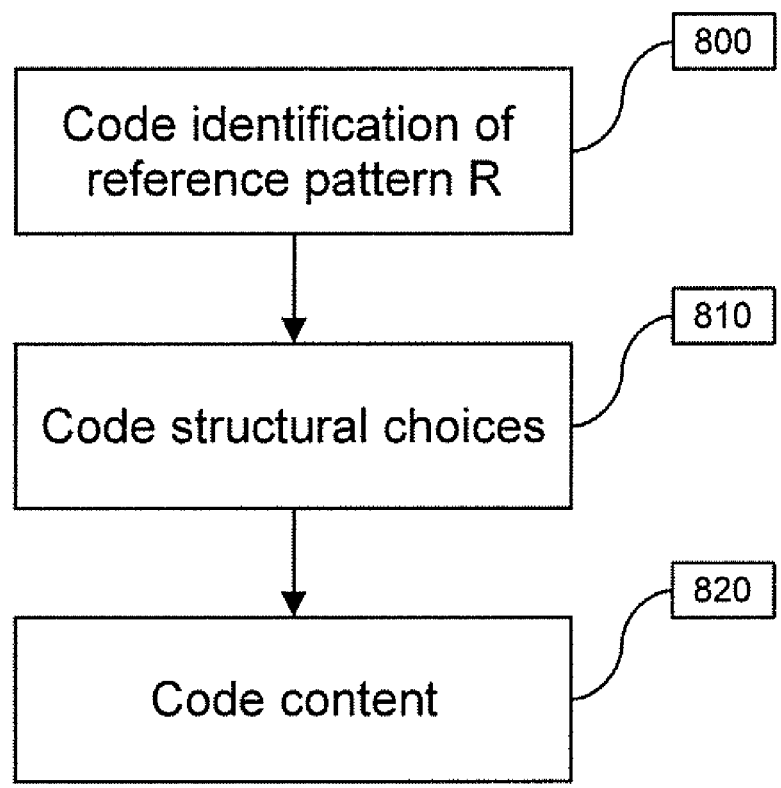
FIG. 8 depicts an algorithm for coding an element according to a reference pattern in accordance with the invention.

An algorithm for coding an element E according to a reference pattern R is now described with reference to FIG. 8.

According to this algorithm, in order to code an item E that is not associated with a reference pattern, the whole of the structure of the item E and its content is coded directly using a known method (for example FastInfoset).

The algorithm begins at step 800, consisting of coding the identification of the reference pattern R. This makes it possible to keep the association between the reference pattern R and the item E.

Then the algorithm continues at step 810, during which there are coded the structural choices made for the item E with respect to its reference pattern R.

Finally, the algorithm codes the content of the item E during the following step (step 820). During this step, the content of the item E corresponding to the part of the item E described by the reference pattern R and not specified in the definition of the reference pattern R (or specified in the definition of the reference pattern R with a different value) is coded.

Figure 9:
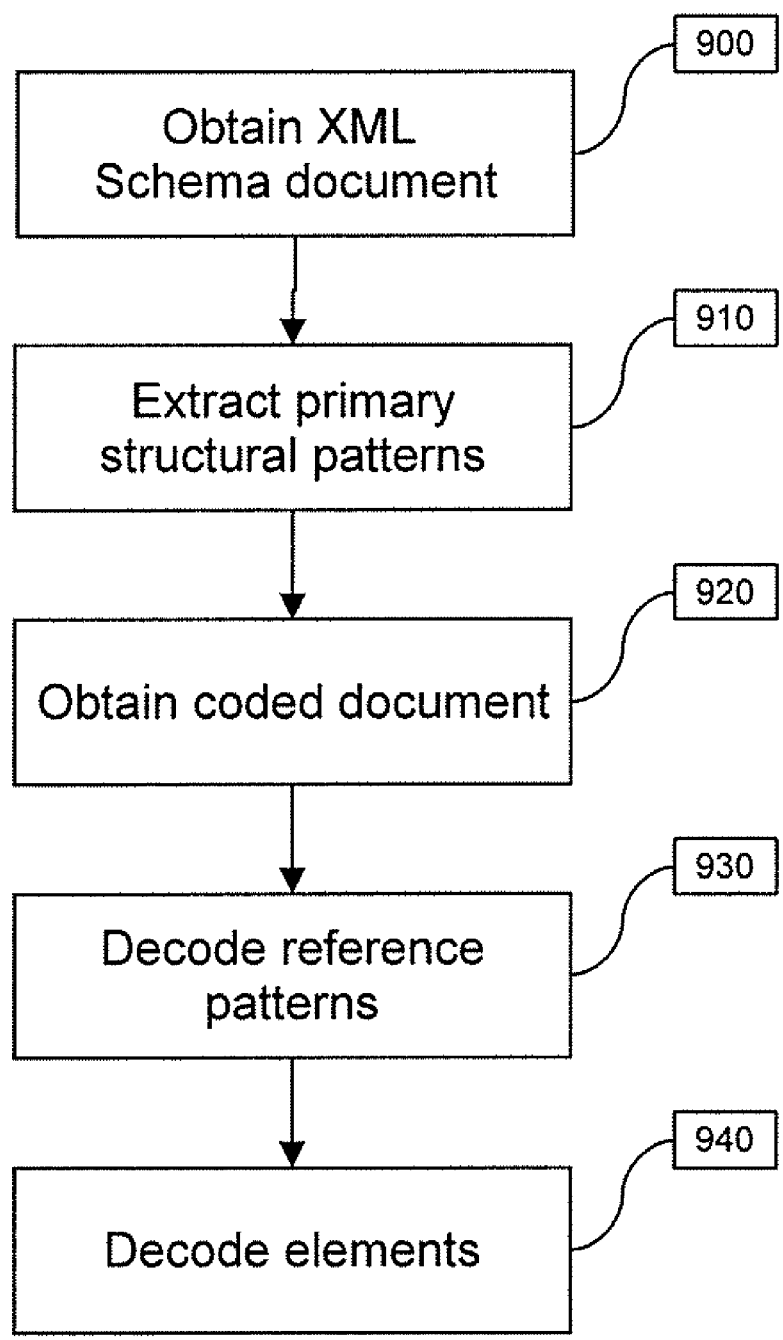
FIG. 9 depicts an general algorithm for decoding a document coded according to the algorithms of FIGS. 3 to 8.

A general algorithm for decoding a document coded according to the algorithms described above is now described with reference to FIG. 9.

The first two steps of the algorithm (steps 900 and 910) are similar to steps 300 and 310 of the coding algorithm described with reference to FIG. 3. These steps make it possible to recreate the primary structural patterns used by the processing of the decoding. To do this, step 900 consists of obtaining a document storing an XML schema and, during step 910, primary structural patterns are extracted from this XML schema.

Next the algorithm continues at step 920, during which a coded document is obtained.

During the following step (step 930), from the coded document, the reference patterns are decoded. For each reference pattern, the identification of the primary structural patterns is decoded and it is therefore possible to obtain the primary structural pattern.

From the primary structural pattern, any indications concerning the part of the primary structural pattern corresponding to this reference pattern, structural choices and values of contents decoded from the document, the reference pattern is reconstructed.

Step 930 is followed by step 940, during which the items constituting the XML document are decoded. For each item, the identification of the reference pattern used is decoded and the reference pattern is obtained.

Then, from this reference pattern, the structural choices and the content decoded from the document, the element is reconstructed.

It should be noted that steps 930 and 940 may be merged in order to be performed for each reference pattern and each element as they are read in the coded document.

In order to implement the methods of generating reference patterns able to represent hierarchized data and coding this data using these reference patterns, a reference pattern generation device comprises means of extracting primary structural patterns from the schema, means of associating items in the plurality of items with at least one primary structural pattern extracted, means of grouping the items associated according to a predetermined criterion and means of determining a reference pattern per group of items from the associated primary structural patterns, a device for coding hierarchized data, the hierarchized data being structured in accordance with a schema, comprises means of obtaining reference patterns, means of determining difference information between the reference patterns and the associated hierarchized data, and means of coding the hierarchized data according to the reference patterns and difference information and a decoding device comprising in particular means of decoding the hierarchized data according to the reference patterns and difference information.

Figure 10:
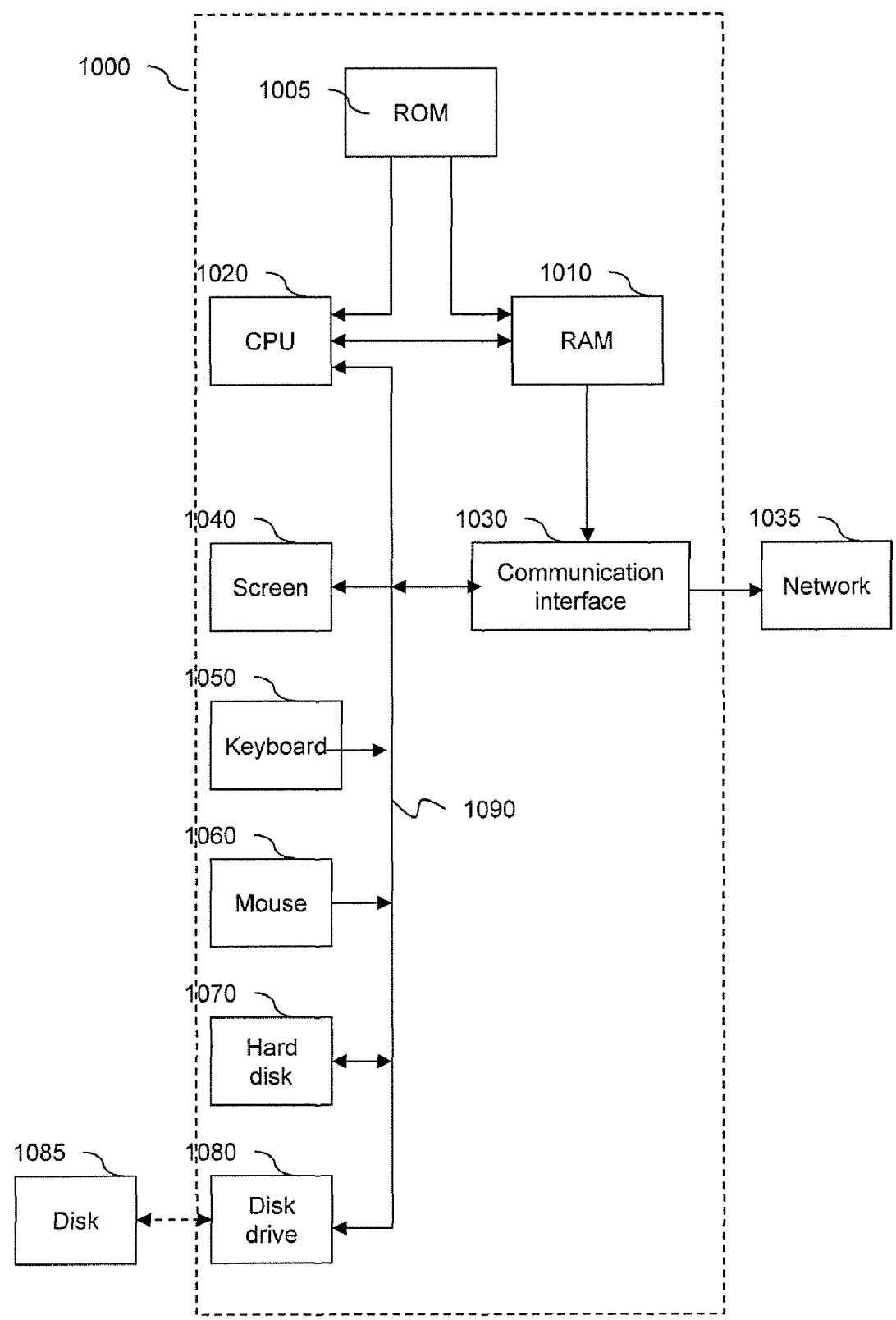
FIG. 10 depicts a block diagram illustrating a device able to implement the present invention.

These reference pattern generation and coding devices can be incorporated in a computer 1000 as illustrated in FIG. 10.

In particular, the various means identified above can be incorporated in a read-only memory 1005 (ROM) able to store a pattern generating and/or coding program in accordance with the invention.

The random access memory 1010 (RAM) is adapted to store in registers the values modified during the execution of the generation and coding program.

The microprocessor 1020 is integrated in a computer 1000, which can be connected to various peripherals and to other computers in a communication network.

This computer comprises in a known manner a communication interface 1030 connected to the communication network 1035 in order to receive or transmit messages. The computer also comprises document storage means such as a hard disk 1070 or is adapted to cooperate by means of a disk drive 1080 (diskettes, compact disks or computer cards) with removable document storage means, such as disks 1085. These fixed or removable storage means can comprise the code of the pattern generating or coding method according to the invention.

They are also adapted to store an electronic document containing hierarchized documents as defined by the present invention.

By way of variant, the program enabling the pattern generating or coding device to implement the invention can be stored in the read-only memory 1005.

In a second variant, the program can be received in order to be stored as described previously by means of the communication network 1035. The computer 1000 also has a screen 1040 making it possible for example to serve as an interface with an operator by means of the keyboard 1050 or the mouse 1060 or any other means.

The central unit 1020 (CPU) will then execute the instructions relating to the implementation of the invention. On powering up, the programs and methods relating to the invention stored in a non-volatile memory, for example the memory 1005, are transferred into the memory 1010 which will then contain the executable code of the invention as well as the variables necessary for implementing the invention.

The communication bus 1090 affords communication between the various sub-elements of the computer or connected to it.

The representation of this bus 1090 is not limiting and in particular the microprocessor 1020 is able to communicate instructions to any sub-element directly or by means of another sub-element.

Naturally, many modifications can be made to the example embodiments described above without departing from the scope of the invention.

The invention claimed is:

1. A method of generating reference patterns able to represent hierarchized data, the hierarchized data being structured in accordance with a schema, the schema defining the structure of the hierarchized data, and the hierarchized data being organized in a plurality of items, the method comprising a step of providing a computer microprocessor configured for carrying out the steps of:

obtaining the schema defining the structure of the hierarchized data;

extracting primary structural patterns from the schema defining the structure of the hierarchized data, each of the primary structural patterns representing a set of structural information;

creating a list of instances for at least one extracted primary structural pattern, each instance associating items of the plurality of items with a corresponding primary structural pattern;

grouping instances of one and a same primary structural pattern into one or several groups of instances according to a predetermined similarity criterion applied on items of distinct instances;

extracting at least one piece of structural information common to each instance of one of the groups of instances, for each of the groups of instances, and generating one reference pattern from the primary structural pattern associated with the one group of instances, the reference pattern including the extracted at least one piece of structural information, wherein the steps of extracting at least one piece of structural information and generating one reference pattern comprise the following sub-steps for at least one group of instances:

extracting the structural information and content information common to a high number of instances in the group; and generating a reference pattern containing the structural information and the common content information extracted, the reference pattern being able to represent some of the structural information and the content information of items in the group, wherein, when the number of instances in the group of instances is below a predetermined threshold, the group of instances is assembled with another group of instances, and wherein the group of instances is assembled with the group of instances closest to the group of instances with respect to a distance measurement.

2. The generation method according to claim 1, wherein the grouping of the instances in groups of instances is performed by grouping the instances having identical content information.

3. The generation method according to claim 2, wherein the reference pattern also comprises at least one piece of content information present in a high number of instances in the group.

4. The generation method according to claim 1, wherein the grouping of the instances in groups of instances is performed by grouping instances having identical structural information.

5. The generation method according to claim 4, wherein the reference pattern also comprises at least one piece of structural information common to a high number of instances in the group.

6. The generation method according to claim 1, wherein the distance measurement between two groups of instances depends on the number of differences between the primary structural patterns associated with the instances.

7. The generation method according to claim 6, wherein the distance measurement between two groups of instances depends on the number of differences between the structural information and the content information of the instances.

8. The generation method according to claim 7, wherein, in the absence of a group of instances situated at a distance less than a predetermined threshold, for instances in the group, the reference pattern is the primary structural pattern associated with this instances.

9. The generation method of claim 1, wherein the primary structural pattern used for generating the reference pattern for one group of instances is chosen as being the closest to the at least one piece of structural information common to each instance of the one of the group of instances.

10. The generation method of claim 9, further comprising a step of decomposing the extracted primary structural patterns comprising the at least one piece of structural information common to each instance of one of the group of instances, the extracted primary structural patterns comprising the at least one piece of structural information common to each instance of the one of the group of instances being associated with the reference pattern, the extracted primary structural patterns not comprising the at least one piece of structural information common to each instance of the one of the group of instances being grouped all together.

11. The generation method of claim 1, further comprising the step of checking whether the at least one piece of structural information common to each instance of the one of the group of instances is important, the step of generating the reference pattern being carried out in response to the step of checking whether the at least one piece of structural information common to each instance of one of the group of instances is important.

12. The generation method of claim 1, used for coding the hierarchized data, the method further comprising the steps of:
    determining difference information between the reference patterns and the associated hierarchized data; and
    coding the hierarchized data according to the reference patterns and difference information.

13. A device for generating reference patterns able to represent hierarchized data, the hierarchized data being structured in accordance with a schema, the schema defining the structure of the hierarchized data, and the hierarchized data being organized in a plurality of items, said device comprising:
    at least one computer microprocessor operable to perform:
    obtaining the schema defining the structure of the hierarchized data;
    extracting primary structural patterns from the schema defining the structure of hierarchized data, each of the primary structural patterns representing a set of structural information;
    creating a list of instances for at least one extracted primary structural pattern, each instance associating items of the plurality of items with a corresponding primary structural pattern;
    grouping instances of one and a same primary structural pattern into one or several groups of instances according to a predetermined similarity criterion applied on items of distinct instances; and
    extracting at least one piece of structural information common to each instance of one of the groups of instances, for each of the groups of instances, and
    generating one reference pattern from the primary structural pattern associated to the one group of instances, the reference pattern including the extracted at least one piece of structural information,
    wherein the steps of extracting at least one piece of structural information and generating one reference pattern comprise the following sub-steps for at least one group of instances:
    extracting the structural information and content information common to a high number of instances in the group; and
    generating a reference pattern containing the structural information and the common content information extracted, the reference pattern being able to represent some of the structural information and the content information of items in the group,
    wherein, when the number of instances in the group of instances is below a predetermined threshold, the group of instances is assembled with another group of instances, and
    wherein the group of instances is assembled with the group of instances closest to the group of instances with respect to a distance measurement.

14. A non-transitory computer-readable storage medium storing instructions of a computer program instructing a computer or microprocessor to implement a method of generating reference patterns able to represent hierarchized data, the hierarchized data being structured in accordance with a schema, the schema defining the structure of the hierarchized data, and the hierarchized data being organized in a plurality of items, the method comprising:
    obtaining the schema defining the structure of the hierarchized data;
    extracting primary structural patterns from the schema defining the structure of the hierarchized data, each of the primary structural patterns representing a set of structural information;
    creating a list of instances for at least one extracted primary structural pattern, each instance associating items of the plurality of items with a corresponding primary structural pattern;
    grouping instances of one and a same primary structural pattern into one or several groups of instances according to a predetermined similarity criterion applied on items of distinct instances; and
    extracting at least one piece of structural information common to each instance of one of the groups of instances, for each of the groups of instances, and
    generating one reference pattern from the primary structural pattern associated with the one group of instances, the reference pattern including the extracted at least one piece of structural information,
    wherein the steps of extracting at least one piece of structural information and generating one reference pattern comprise the following sub-steps for at least one group of instances:
    extracting the structural information and content information common to a high number of instances in the group; and
    generating a reference pattern containing the structural information and the common content information extracted, the reference pattern being able to represent some of the structural information and the content information of items in the group,
    wherein, when the number of instances in the group of instances is below a predetermined threshold, the group of instances is assembled with another group of instances, and
    wherein the group of instances is assembled with the group of instances closest to the group of instances with respect to a distance measurement.

* * * * *